United States Patent [19]

Emori

[11] Patent Number: 4,770,805

[45] Date of Patent: Sep. 13, 1988

[54] COMPOSITION AND METHOD FOR REMOVING PHOTOSENSITIVE RESIN FILM FROM BASEBOARD FOR INTEGRATED CIRCUIT

[76] Inventor: Shoichi Emori, 4-4-5 Minami Misaki, Funabashi-shi, Chiba-ken, Japan

[21] Appl. No.: 943,402

[22] Filed: Dec. 19, 1986

[51] Int. Cl.⁴ .................. B09K 13/00; B09K 13/02
[52] U.S. Cl. .................... 252/791; 252/79.5; 156/664; 156/668
[58] Field of Search .............. 252/79.1, 79.5, 156; 156/664, 668; 422/15, 16, 12

[56] References Cited

U.S. PATENT DOCUMENTS

| | | | |
|---|---|---|---|
| 4,098,720 | 7/1978 | Hwa | 422/16 |
| 4,101,441 | 7/1978 | Hwa et al. | 422/15 |
| 4,483,739 | 11/1984 | Too et al. | 252/79.5 |

Primary Examiner—David L. Lacey
Assistant Examiner—Lori-Ann Johnson
Attorney, Agent, or Firm—Armstrong, Nikaido, Marmelstein & Kubovcik

[57] ABSTRACT

An improved composition consisting essentially of an alkali solution and 3,5-dimethyl pyrazole, for removing a photosensitive resin film from a baseboard for an integrated circuit following formation of a tin-lead solder circuit on the baseboard. A method for removing the photosensitive resin without dissolving the tin-lead circuit by applying the improved composition.

2 Claims, No Drawings

COMPOSITION AND METHOD FOR REMOVING PHOTOSENSITIVE RESIN FILM FROM BASEBOARD FOR INTEGRATED CIRCUIT

BACKGROUND OF THE INVENTION

1. Technical Field

This invention relates to a composition for removing a photosensitive resin film from a baseboard for an integrated circuit following formation of a tin-lead solder circuit on the baseboard, and a method for performing the removal of the photosensitive resin film from the integrated circuit baseboard following formation of the tin-lead circuit on the baseboard.

2. Prior Art

At the present time, in the production of integrated circuit base boards, for the purpose of removing the photosensitive resin film on the base board which has become unnecessary after a tin-lead solder circuit has been formed on the baseboard, an alkali solution such as a caustic soda, caustic potash or sodium carbonate solution has been employed to dissolve the photosensitive resin film. However, since these alkali solutions have the inherent property to etch-dissolve the solder as well as the photosensitive resin film, the solder circuit formed on the IC base board is etch-dissolved, resulting in the production of an unacceptable product.

In order to solve the problem of dissolution of the tin-lead solder circuit in the alkali solution of the prior art improved compositions and methods have been sought.

SUMMARY OF THE INVENTION

The inventor endeavoured to solve the problem and has found that when to any one of the above-mentioned alkali solutions is added 3,5-dimethyl pyrazole (referred to as "DMP" hereinafter), the etch-dissolving action of the alkali solution on solder is substantially reduced. The present invention is based on the finding.

The above and other objects and attendant advantages of the present invention will be more readily apparent to those skilled in the art from a reading of the following detailed description by way of specific examples thereof which merely illustrate the invention, but not limit the scope of the same in any way.

Thus, the present invention has its object to provide a composition and a method for removing a photosensitive resin film from a baseboard for an integrated circuit following formation of a tin-lead solder on the baseboard which eliminates. the problem of dissolution of the tin-lead solder inherent in the use of the alkali solution for removing the photosensitive resin film.

According to the present invention, there has been provided a composition consisting essentially of an alkali solution and 3,5-dimethyl pyrazole.

According to another aspect of the present invention, there has been provided a method for removing a photosensitive resin film from a baseboard for an integrated circuit following formation of a tin-lead solder circuit on said baseboard, said method comprising the step of applying to the baseboard having the photosensitive resin film and the solder circuit film formed thereon a composition consisting essentially of an alkali solution and 3,5-dimethyl pyrazole.

PREFERRED EMBODIMENT OF THE INVENTION

Dissolving Test

Tests were conducted to determine the dissolution of tin-lead alloys in the above-mentioned alkali solutions containing the inventive etching control agent and the corresponding alkali solutions without the etching control agent and the test results are shown below.

(1) Test Piece:

A brass board having the width of 2 cm and the length of 10 cm was electroplated on each of the opposite major surfaces with a tin-lead alloy (consisting of 60% of tin and 40% of lead) by the thickness of $100\mu$ to provide a test piece. The same procedure was repeated to provide a number of test pieces required for tests.

(2) Test Solution:

To each of 3% caustic soda, 3% caustic potash and 3% sodium carbonate solution were added 0.1%, 0.2%, 0.5% and 1% of DMP, respectively, to provide test compositions according to the invention. The corresponding three types of alkali solutions without DMP were employed as controls.

(3) Test Procedure:

200 ml of each of the above-mentioned test compositions and controls described in (2) was placed into a 200 ml beaker. Each of the test pieces (1) was immersed in each test composition in the beaker, left as it is at the environmental temperature for 200 hours, washed with water and then dried. The test pieces were observed for the reduction in thickness of the solder plating layer.

(4) Test Results:

| Alkali Solution | Amount of DMP (%) | | | | |
|---|---|---|---|---|---|
| | 0 | 0.1 | 0.2 | 0.5 | 1.0 |
| 3% caustic soda | $36.0\mu$ | $18.0\mu$ | $11.7\mu$ | $10.3\mu$ | $9.4\mu$ |
| 3% caustic potash | $32.6\mu$ | $16.4\mu$ | $11.3\mu$ | $9.5\mu$ | $8.8\mu$ |
| 3% sodium carbonate | $20.3\mu$ | $10.0\mu$ | $6.5\mu$ | $5.6\mu$ | $5.0\mu$ |

As is clear from the test results, the amounts of reduction in thickness of the tin-lead alloy layers by the compositions containing DMP are substantially less as compared with the reduction in thickness of the tin-lead alloy layers by the solutions without DMP. Thus, the compositions of the invention exhibits an excellent etching control effect.

The present invention will be now described by way of specific examples thereof which illustrate the present invention, but do not limit the scope of the same in any way.

EXAMPLE 1

3% caustic soda solution containing 0.5% of DMP and maintained at 50° C. was sprayed against a solder plated base board for 3 minutes to dissolve the photosensitive resin on the base board. The solder circuit presented a silver color and showed no trace of etching.

CONTROL 1

Except for the use of 3% caustic soda without DMP, the same procedure as that described in connection with Example 1 was followed. The solder circuit presented a dark gray color and showed saw-toothed etching.

EXAMPLE 2

A 3% caustic potash solution containing 0.6% of DMP and maintained at 50° C. was sprayed against a solder plated base board for 15 minutes. The solder circuit presented a silver color and scarcely showed reduction in thickness.

CONTROL 2

Except for the use of 3% caustic potash without DMP, the same procedure as that described in connection with Example 2, was followed. The solder circuit presented a dark gray color throughout its whole area and showed local cuts by dissolution.

EXAMPLE 3

3% sodium carbonate containing 0.4% of DMP and maintained at 50° C. was sprayed against a solder plated base board for five minutes. The solder circuit presented a bright silver color and showed no etching trace.

CONTROL 3

Except for the use of 3% sodium carbonate without DMP, the same procedure as that described in connection with Example 3 was followed. The solder circuit presented a dark gray color and showed some etching by solution.

The advantages of the present invention, as well as certain changes and modifications of the disclosed embodiments thereof, will be readily apparent to those skilled in the art. It is the inventor's intention to cover by his claims all those changes and modifications of the invention without departing from the spirit and scope of the invention. Protection by Letters Patent of this invention in all its aspect as the same is set forth in the appended claims is sought to the broadest extent that the prior art allows.

What is claimed is:

1. A composition for removing a photosensitive resin film from a baseboard for an integrated circuit following formation of a tin-lead solder circuit on said baseboard, said composition consisting of aqueous alkali solution and 0.1–1% of 3,5-dimethyl pyrazole based on the amount of alkali solution.

2. The composition of claim 1, wherein said alkali solution is a member selected from the group consisting of solutions of caustic soda, caustic potash and sodium carbonate.

* * * * *